United States Patent
Lee et al.

(10) Patent No.: US 9,590,200 B2
(45) Date of Patent: Mar. 7, 2017

(54) ORGANIC LIGHT EMITTING DEVICE, METHOD OF MANUFACTURING THE SAME, AND ORGANIC LIGHT EMITTING DISPLAY APPARATUS USING THE SAME

(71) Applicant: LG DISPLAY CO., LTD., Seoul (KR)

(72) Inventors: Hak Min Lee, Yongin-si (KR); Hee Jin Kim, Yongin-si (KR); Sung Soo Park, Gwacheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/739,690

(22) Filed: Jun. 15, 2015

(65) Prior Publication Data
US 2016/0190499 A1    Jun. 30, 2016

(30) Foreign Application Priority Data
Dec. 26, 2014  (KR) .................. 10-2014-0191010

(51) Int. Cl.
*H01L 51/50*    (2006.01)
*H01L 27/32*    (2006.01)

(52) U.S. Cl.
CPC ........ *H01L 51/504* (2013.01); *H01L 51/5024* (2013.01)

(58) Field of Classification Search
CPC . H01L 51/52; H01L 51/5044; H01L 51/5056; H01L 51/56; H01L 51/5072
See application file for complete search history.

(56) References Cited

U.S. PATENT DOCUMENTS

| | | | |
|---|---|---|---|
| 2014/0061600 A1* | 3/2014 | Kim | .................. H01L 51/5044 257/40 |
| 2016/0133846 A1* | 5/2016 | Ishii | .................. H01L 51/5004 345/76 |

\* cited by examiner

*Primary Examiner* — Mamadou Diallo
(74) *Attorney, Agent, or Firm* — Dentons US LLP (57) ABSTRACT

Disclosed are an organic light emitting device, a method of manufacturing the same, and an organic light emitting display apparatus using the same. In the organic light emitting device, an electron transporting layer is not provided between an emission layer and an electron injecting layer. Instead, the emission layer includes a first emission layer on a hole transporting layer, and a second emission layer on the first emission layer. The second emission layer includes a same material as a material of the first emission layer and further includes an n-type dopant material.

18 Claims, 4 Drawing Sheets

ORGANIC LIGHT EMITTING DEVICE, METHOD OF MANUFACTURING THE SAME, AND ORGANIC LIGHT EMITTING DISPLAY APPARATUS USING THE SAME

CROSS-REFERENCE TO RELATED APPLICATIONS

This application claims the benefit of the Korean Patent Application No. 10-2014-0191010 filed on Dec. 26, 2014, which is hereby incorporated by reference for all purposes as if fully set forth herein.

BACKGROUND OF THE INVENTION

Field of the Invention

The present invention relates to an organic light emitting device. More particularly, the present invention relates to an organic light emitting device which is manufactured using a solution process.

Discussion of the Related Art

Organic light emitting devices are devices which have a structure, where an emission layer is formed between a cathode injecting an electron and an anode injecting a hole. When the electron generated from the cathode and the hole generated from the anode are injected into the emission layer, the injected electron and hole are combined to generate an exciton, and the exciton is shifted from an excited state to a ground state to emit light.

A related art organic light emitting device will be described with reference FIG. 1.

Figure 1:
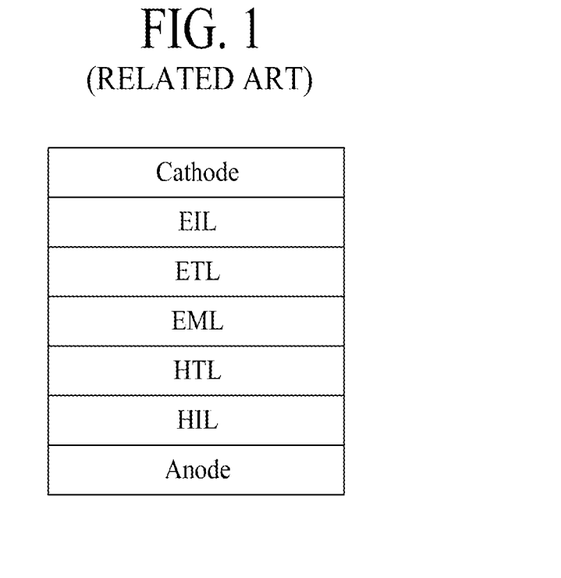
FIG. 1 is a schematic cross-sectional view of a related art organic light emitting device.

FIG. 1 is a schematic cross-sectional view of a related art organic light emitting device.

As seen in FIG. 1, the related art organic light emitting device includes an anode, a hole injecting layer (HIL), a hole transporting layer (HTL), an emission layer (EML), an electron transporting layer (ETL), an electron injecting layer (EIL), and a cathode.

Organic layers, such as the HIL, the HTL, the EML, the ETL, and the EIL which are disposed between the anode and the cathode, are formed through a vacuum deposition process in a vacuum chamber. However, since the vacuum deposition process is used, high-cost vacuum deposition equipment is needed, and for this reason, the manufacturing cost increases. Particularly, when a size of an organic light emitting device increases, a size of the vacuum deposition equipment further increases. For this reason, productivity is lowered in mass production.

Therefore, ongoing research on a method of forming the organic layers through a solution process is being performed. As a result, a method of forming the HIL, the HTL, and the EML through the solution process has been proposed. However, a method of forming the ETL disposed on the EML through the solution process is not yet developed. This is because when the ETL is formed by the solution process, a surface of the EML is damaged by a solvent contained in a solution which is used to form the EML. To date, therefore, only the HIL, the HTL, and the EML are formed by the solution process, and the ETL and the EIL are formed by the vacuum deposition process. In this case, productivity is more enhanced than a case where all the organic layers are formed by the vacuum deposition process. However, productivity is still lowered in a case of manufacturing a large-size organic light emitting device.

SUMMARY OF THE INVENTION

Accordingly, the present invention is directed to an organic light emitting device, a method of manufacturing the same, and an organic light emitting display apparatus using the same that substantially obviate one or more problems due to limitations and disadvantages of the related art.

An aspect of the present invention is directed to an organic light emitting device, a method of manufacturing the same, and an organic light emitting display apparatus using the same, in which productivity is enhanced by reducing a vacuum deposition process as much as possible.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting device including: an anode; a hole injecting layer on the anode; a hole transporting layer on the hole injecting layer; an emission layer on the hole transporting layer, wherein the emission layer includes a host material and a dopant material; an electron injecting layer on the emission layer; and a cathode on the electron injecting layer, wherein the emission layer includes a first emission layer on the hole transporting layer and a second emission layer on the first emission layer, and the second emission layer includes a same material as a material of the first emission layer and further includes an n-type dopant material.

In another aspect of the present invention, there is provided a method of manufacturing an organic light emitting device including: forming a hole injecting layer on an anode using a solution process; forming a hole transporting layer on the hole injecting layer using a solution process; forming an emission layer on the hole transporting layer through the solution process, the emission layer including a host material and a dopant material; forming an electron injecting layer on the emission layer through a vacuum deposition process, the electron injecting layer including n-type dopants; and forming a cathode on the electron injecting layer, wherein the forming the electron injecting layer comprises diffusing the n-type dopants to the emission layer to form a first emission layer, to which the n-type dopants are not diffused, and a second emission layer with the n-type dopants diffused thereto.

In another aspect of the present invention, there is provided an organic light emitting display apparatus including: a substrate; a thin film transistor disposed on the substrate; and an organic light emitting device, wherein emission of light from the organic light emitting device being controlled by the thin film transistor, wherein the organic light emitting device includes: an anode; a hole injecting layer on the anode; a hole transporting layer on the hole injecting layer; an emission layer on the hole transporting layer, wherein the emission layer includes a host material and a dopant material; an electron injecting layer on the emission layer; and a cathode on the electron injecting layer. The emission layer includes a first emission layer on the hole transporting layer, and a second emission layer on the first emission layer, and the second emission layer includes a same material as a material of the first emission layer and further includes an n-type dopant material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Reference will now be made in detail to exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through the following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only' is used. The terms of a singular form may include plural forms unless referred to the contrary.

In construing an element, the element is construed as including an error range although there is no explicit description.

In describing a positional relationship, for example, when a positional relationship between two parts is described as 'on', 'over', 'under', and 'next', one or more other parts may be disposed between the two parts unless 'just', 'direct' or 'directly' is used.

In describing a time relationship, for example, when the temporal order is described as 'after', 'subsequent', 'next', and 'before', a case which is not continuous may be included unless 'just' or 'directly' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of the present invention will be described in detail with reference to the accompanying drawings.

Figure 2:
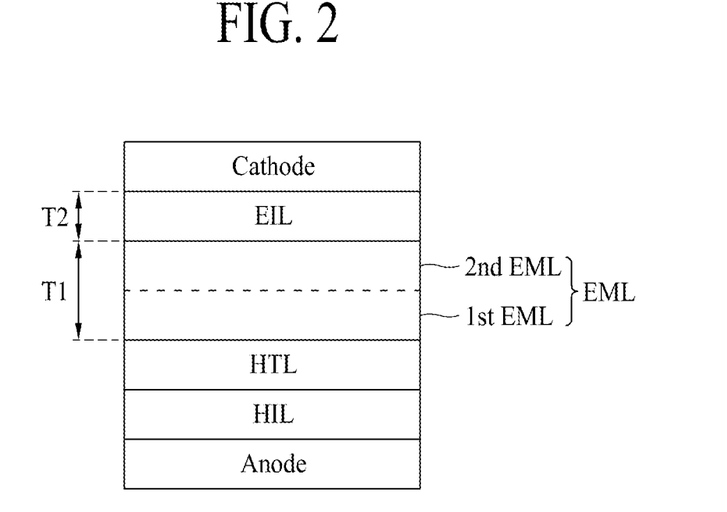
FIG. 2 is a schematic cross-sectional view of an organic light emitting device according to an embodiment of the present invention.

FIG. 2 is a schematic cross-sectional view of an organic light emitting device according to an embodiment of the present invention.

As seen in FIG. 2, the organic light emitting device according to an embodiment of the present invention an anode, a hole injecting layer (HIL), a hole transporting layer (HTL), an emission layer (EML), an electron injecting layer (EIL), and a cathode.

The anode may be formed of a transparent conductive material having high conductivity and a high work function, for example, indium tin oxide (ITO), indium zinc oxide (IZO), $SnO_2$, ZnO, and/or the like, but is not limited thereto.

The HIL may be formed on the anode and may be formed of 4,4',4"-tris(3-methylphenylphenylamino)triphenylamine (MTDATA), copper phthalocyanine (CuPc), poly(3,4-ethylenedioxythiophene, polystyrene sulfonate) (PEDOT/PSS), or the like, but is not limited thereto.

The HIL may be formed by a solution process. That is, the HIL may be formed by a process where a solution for the HIL is prepared by dissolving an organic material having a hole-injecting characteristic in a solvent, and then, the prepared solution is coated on the anode through an inkjet process or a slit coating process.

The HTL may be formed on the HIL and may be formed of N,N'-diphenyl-N,N'-bis(3-methylphenyl)-1,1'-bi-phenyl-4,4'-diamine (TPD), N,N-dinaphthyl-N,N'-diphenyl-benzidine (NPD), N,N'-di(naphthalen-1-yl)-N,N'-diphenyl-benzidine (NPB), or the like, but is not limited thereto.

The HTL may also be formed by the solution process. That is, the HTL may be formed by a process where a solution for the HTL is prepared by dissolving an organic material having a hole-transporting characteristic in a solvent, and then, the prepared solution is coated on the HIL through the inkjet process or the slit coating process.

In forming the HTL, the HIL should not be damaged by a solvent contained in a solution for the HTL. Therefore, an organic material having a hole-injecting characteristic included in the HIL may not be dissolved by a solvent contained in a solution for the HTL. For example, when the organic material having the hole-injecting characteristic included in the HIL uses an organic material which is dissolved by water but is not dissolved by a specific organic solvent, and an organic material having a hole-transporting characteristic included in the HTL uses an organic material which is dissolved by the specific organic solvent, the HIL is not damaged in forming the HTL through the solution process.

Moreover, in forming the EML, the HTL should not be damaged by a solvent contained in a solution for the EML. To this end, a cross-linking agent may be added into the HTL, and thus, a bonding force of the HTL is enhanced. That is, when the cross-linking agent is added into in the HTL, a bonding force of an organic material is enhanced by the cross-linking agent, and thus, the HTL is prevented from being dissolved by the solvent contained in the solution for the EML.

The cross-linking agent may be added into the EML, and thus, a bonding force of the EML increases. Accordingly, even when the ETL is formed on a top of the EML through the solution process, the top of the EML is not damaged. However, when the cross-linking agent is added into the EML, an emission efficiency of the EML is rapidly reduced, and for this reason, the cross-linking agent cannot be added into the EML, and consequently, it is difficult to form the ETL on the top of the EML through the solution process. Therefore, in an embodiment of the present invention, the ETL may not be formed on the top of the EML. This will be described below.

The EML may be formed on the HTL. The EML may be formed as a red (R) emission layer, a green (G) emission layer, or a blue (B) emission layer, and depending on the case, the EML may be formed as a white (W) emission layer.

The red (R) emission layer may include an organic material for emitting red (R) light, for example, a peak wavelength range which is 600 nm to 640 nm. In detail, the red emission layer may be formed by doping a red (R) dopant on a phosphorescent host material consisting of a carbazole-based compound or a metal complex, but is not limited thereto. The red dopant may consist of a metal complex of iridium (Ir) or platinum (Pt), but is not limited thereto.

The green (G) emission layer may include an organic material for emitting green (G) light, for example, a peak wavelength range which is 500 nm to 570 nm. In detail, the green emission layer may be formed by doping a phosphorescent green (G) dopant on a phosphorescent host material consisting of a carbazole-based compound or a metal complex, but is not limited thereto. The carbazole-based compound may include 4,4-N,N'-dicarbazole-biphenyl (CBP), CBP derivatives, N,N'-dicarbazolyl-3,5-benzene (mCP), mCP derivatives, or the like, and the metal complex may include a phenyloxazole (ZnPBO) metal complex, a phenylthiazole (ZnPBT) metal complex, or the like.

The blue (B) emission layer may include an organic material for emitting blue (B) light, for example, a peak wavelength range which is 430 nm to 490 nm. In detail, the blue emission layer may be formed by doping a fluorescent blue (B) dopant on at least one fluorescent host material selected from the group consisting of anthracene derivatives, pyrene derivatives, and perylene derivatives, but is not limited thereto.

The white (W) emission layer may be formed by doping the above-described red (R) dopant, green (G) dopant, and blue (B) dopant on a host material, or may be formed by doping the red (R) dopant and the green (G) dopant on a blue fluorescent host material which emits blue (B) light, but is not limited thereto.

The EML may also be formed by the solution process. That is, the EML may be formed by a process where a solution for the EML is prepared by dissolving a host material and a dopant material in a solvent, and then, the prepared solution is coated on the HTL through the inkjet process or the slit coating process.

The EML may include a first EML and a second EML. The first EML may be formed on the HTL, and the second EML may be formed on the first EML.

According to an embodiment of the present invention, an ETL is not provided between an EML and an EIL. Instead, the EML may include the first EML and the second EML, and an electron-transporting characteristic is enhanced by the second EML.

The ETL is not provided between the EML and the EIL, and thus, when the EIL is formed just on the top of the EML, an electron generated from the cathode is not smoothly transported from the ETL to the EML, causing a reduction in a performance of an organic light emitting device. The ETL which is formed by a deposition process may not be provided for enhancing productivity. However, when the ETL is not provided, a performance of an organic light emitting device is reduced. Thus, it is required to develop a method for enhancing an electron-transporting characteristic even when the ETL is not provided. In an embodiment of the present invention, the second EML is introduced to enhance the electron-transporting characteristic. The second EML will be described below in detail.

Figure 3:
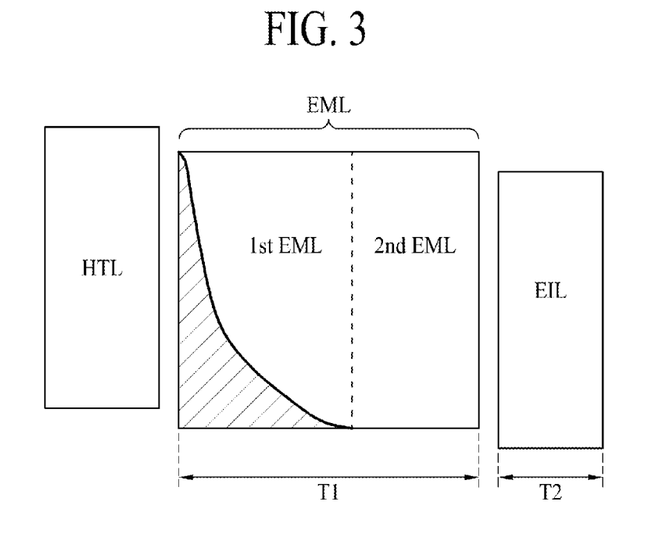
FIG. 3 illustrates an area where an exciton is generated in an EML according to an embodiment of the present invention.

FIG. 3 illustrates an area where an exciton is generated in an EML according to an embodiment of the present invention.

In the EML, an electron and a hole may be combined to generate an exciton, and the exciton may be shifted from an excited state to a ground state to emit light. Therefore, an exciton generation area may be an emission area where light is emitted, and a position of the emission area may be controlled based on an electron mobility and a hole mobility. According to an embodiment of the present invention, the electron mobility is greater than the hole mobility in the EML. That is, a mobility of an electron which moves in a direction from the EIL to the EML may be greater than that of a hole which moves in a direction from the HTL to the EML. Therefore, an electron and a hole may be combined in a partial region (i.e., a region of the first EML) of the EML close to the HTL in a whole region of the EML, and thus, an exciton generation area may be disposed in the region of the first EML.

As described above, in order for an exciton to be generated in the region of the first EML close to the HTL, the EML according to an embodiment of the present invention may include an electron-rich emitting material. That is, since the EML according to an embodiment of the present invention includes the electron-rich emitting material, an electron mobility in the EML increases, and thus, light is emitted in the region of the first EML.

The electron-rich emitting material included in the EML may be produced by chemically bonding a provider of an electron, to a host material constituting the EML. Alternatively, the electron-rich emitting material included in the EML may be produced by chemically bonding the provider of the electron, to a dopant material constituting the EML. Alternatively, the electron-rich emitting material included in the EML may be produced by mixing the provider of an electron, with the host material and the dopant material which constitute the EML. That is, the provider of an electron may be chemically bonded to an emitting material constituting the EML or may be mixed with the emitting material without being chemically bonded to the emitting material.

The provider of an electron capable of being chemically bonded to the host material or the dopant material constituting the EML may include a moiety such as pyridine or quinolone, but is not limited thereto. The provider of an electron capable of being mixed with the host material and the dopant material constituting the EML may include an organic material having an electron-transporting characteristic.

The second EML, where an exciton is not generated or the number of generated excitons is small, may have an electron-transporting ability so as to receive an electron from the EIL and will transfer the received electron to the first EML. In order to give the electron-transporting ability, the second EML may include an n-type dopant. When the second EML includes the n-type dopant, an electron injected from the EIL is easily transferred to the first EML. The n-type dopant may use a material of the EIL. In this case, when forming the EIL, the materials of the EIL may be diffused to the EML. Thus, an area to which the materials of the EIL are diffused may correspond to the second EML with the n-type dopant doped thereon. In detail, the n-type dopant may be produced by diffusing an alkali metal included in the EIL.

When the second EML is formed by diffusing the n-type dopants included in the EIL as described above, the second EML may be obtained without performing a separate process. When the second EML is formed by diffusing the n-type dopants included in the EIL, a concentration of the n-type dopants included in the second EML may not be constant. In detail, a concentration of the n-type dopants in a region of the second EML close to the EIL may be higher than that of the n-type dopants in a region of the second EML far away from the EIL.

A thickness T1 of the EML may be set in consideration of a region of the second EML. When the thickness T1 of the EML is too thin, a region of the first EML to which the n-type dopants included in the EIL are not diffused is reduced compared to a region of the second EML to which the n-type dopants included in the EIL are diffused, and thus, an emission area is reduced. Also, when the thickness T1 of the EML is too thick, a third layer which cannot emit light and does not have an electron-transporting characteristic may be formed between the first EML and the second EML. That is, when the thickness T1 of the EML is too thick, a non-emission area to which the n-type dopants are not diffused may be formed between the first EML and the second EML.

Considering such features, the thickness T1 of the EML may be set to a range of 50 nm to 100 nm. This is because when the thickness T1 of the EML is less than 50 nm, a region of the first EML is reduced which also decreases an emission area. When the thickness T1 of the EML is greater than 100 nm, an area where light is not emitted and the n-type dopants are not doped may be formed between the first EML and the second EML.

According to an embodiment of the present invention, the first EML may include a provider of an electron in addition to a host material and a dopant material, and the second EML may include the provider of an electron and an n-type dopant in addition to a host material and a dopant material. The provider of an electron, the host material, and the dopant material included in the first EML may be the same as the provider of an electron, the host material, and the dopant material included in the second EML. In the first EML, an exciton may be generated, and thus, light may be emitted.

On the other hand, in the second EML, since an exciton is not generated or the number of generated excitons is small, light is not substantially emitted. Although light is not substantially emitted from the second EML, since a material of the second EML fundamentally includes an emitting material, the second EML may be referred to as an emission layer.

The EIL may be formed on the EML. Particularly, the EIL may contact the second EML. The EIL may include a material (for example, alkali metal) for providing the n-type dopant to the EML.

A thickness T2 of the EIL may be controlled to a degree to which the n-type dopants are diffused to the EML. That is, when the thickness T2 of the EIL is too thin, the n-type dopants may not be diffused to the EML, and thus, the second EML may not be formed. Therefore, the thickness T2 of the EIL may be equal to or greater than 2 nm. For example, when the thickness T2 of the EIL is less than 2 nm, the n-type dopants may not be diffused to the EML, and thus, the second EML may not be formed. The thickness T2 of the EIL may be equal to or less than 10 nm. This is because when the thickness T2 of the EIL is greater than 10 nm, an emission efficiency of an organic light emitting device may be reduced.

The cathode may be formed on the EIL. The cathode may be formed of metal (for example, aluminum (Al), silver (Ag), magnesium (Mg), lithium (Li), or calcium (Ca)) having a low work function, but is not limited thereto.

FIGS. 4A to 4D are schematic cross-sectional views illustrating a process of manufacturing an organic light emitting device according to an embodiment of the present invention and relate to a method of manufacturing the above-described organic light emitting device of FIG. 2.

Figure 4A:
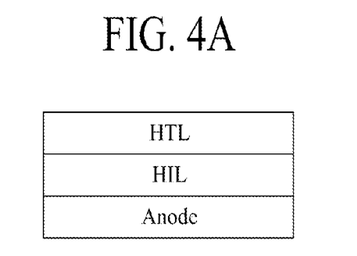
FIGS. 4A to 4D are schematic cross-sectional views illustrating a process of manufacturing an organic light emitting device according to an embodiment of the present invention.

First, as illustrated in FIG. 4A, an HIL may be formed on an anode, and an HTL may be formed on the HIL.

A process of forming the HIL may include a process where a first solution for the HIL is prepared by dissolving an organic material having a hole-injecting characteristic in a first solvent, and then, the prepared first solution is coated on the anode through an inkjet process or a slit coating process.

A process of forming the HTL may include a process where a second solution for the HTL is prepared by dissolving an organic material having a hole-transporting characteristic in a second solvent, and then, the prepared second solution is coated on the HIL through the inkjet process or the slit coating process.

In this case, the organic material having the hole-injecting characteristic may not be dissolved by the second solvent, and thus, a surface of the HIL is not damaged in forming the HTL.

Moreover, a cross-linking agent may be additionally added into the second solvent for the HTL so as to enhance a bonding force of the organic material having the hole-transporting characteristic.

Figure 4B:
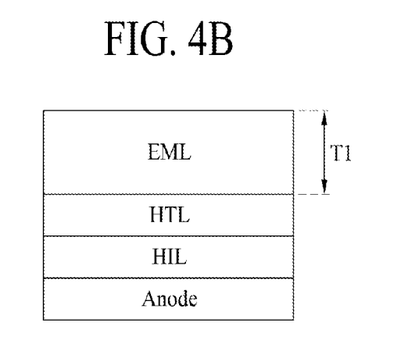

Subsequently, as seen in FIG. 4B, an EML may be formed on the HTL.

A process of forming the EML may include a process where a third solution for the EML is prepared by dissolving a host material and a dopant material in a third solvent, and then, the prepared third solution is coated on the HTL through the inkjet process or the slit coating process.

In this case, the third solution may include a provider of an electron, and thus, the EML may have an electron-rich characteristic. The provider of an electron may be chemically bonded to a host material or a dopant material constituting the EML. The provider of an electron capable of being chemically bonded to the host material or the dopant material may include a moiety such as pyridine or quinolone, but is not limited thereto. The provider of an electron may be included in the EML in a state of being mixed with the host material and the dopant material. The provider of an electron which is included in the EML in the mixed state may include an organic material having an electron-transporting characteristic, but is not limited thereto.

A thickness T1 of the EML may be set to 50 nm to 100 nm. The reason is the same as the above-described details.

Figure 4C:
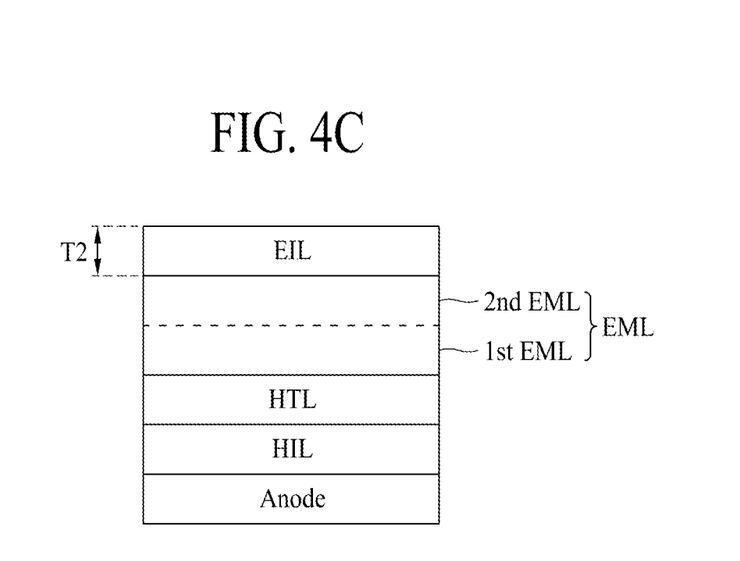

Subsequently, as seen in FIG. 4C, an EIL may be formed on the EML.

The EIL may be formed by a vacuum deposition process such as an evaporation process, a sputtering process, or the like. The EIL may include an n-type dopant material, for example, alkali metal.

When the EIL is formed by the vacuum deposition process, the n-type dopants included in the EIL may be diffused to the EML. Therefore, an area of the EML far away from the EIL, to which the n-type dopants are not diffused may configure a first EML, and an area of the EML close to the EIL, to which the n-type dopants are diffused may configure a second EML. A temperature of the vacuum deposition process may be appropriately controlled for diffusing the n-type dopants.

A thickness T2 of the EIL may be set to 2 nm to 10 nm. The reason is the same as the above-described details.

Figure 4D:
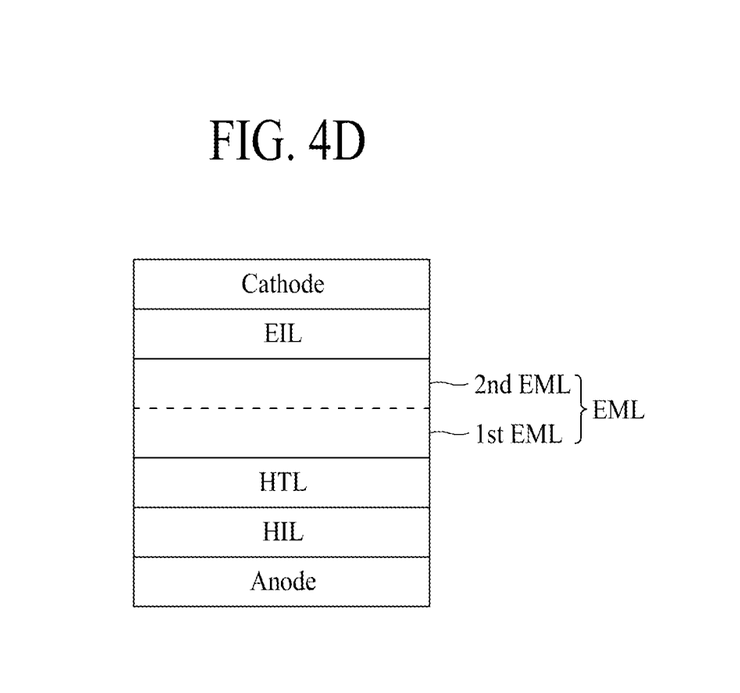

Subsequently, as seen in FIG. 4D, a cathode may be formed on the EIL. The cathode may be formed by a process well known to one of ordinary skill in the art.

Figure 5:
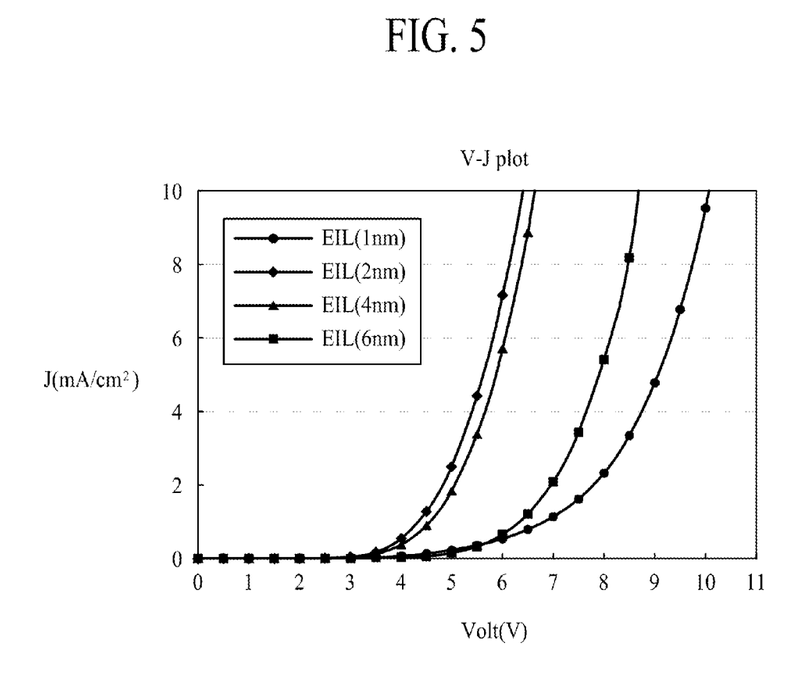
FIG. 5 is a graph showing a voltage-current characteristic change of an organic light emitting device with respect to a thickness change of an EIL.

FIG. 5 is a graph showing a voltage-current characteristic change of an organic light emitting device with respect to a thickness change of an EIL.

As seen in FIG. 5, when a thickness of the EIL is 1 nm, it can be seen that a driving voltage becomes higher than a case where the thickness of the EIL is equal to or greater than 2 nm. This is because in a case where the thickness of the EIL is 1 nm, n-type dopants are not diffused to an EML when the EIL is formed by a deposition process, and for this reason, a second EML is not formed. Therefore, it can be seen that the thickness of the EIL being set to 2 nm or more is appropriate for the smooth diffusion of the n-type dopants. However, it can be seen that even though the thickness of the EIL increases progressively, the driving voltage is not continuously lowered, and when the thickness of the EIL too increases, the driving voltage increases rather. Although not shown in detail, when the thickness of the EIL is greater than 10 nm, the driving voltage may increase similarly to a case where the n-type dopants are not diffused.

The above-described organic light emitting device according to an embodiment of the present invention may be applied to a below-described organic light emitting display apparatus which displays an image, but is not limited thereto. For example, the organic light emitting device according to an embodiment of the present invention may be applied to various light emitting apparatuses, well known to one of ordinary skill in the art, such as illumination apparatus, etc.

Figure 6:
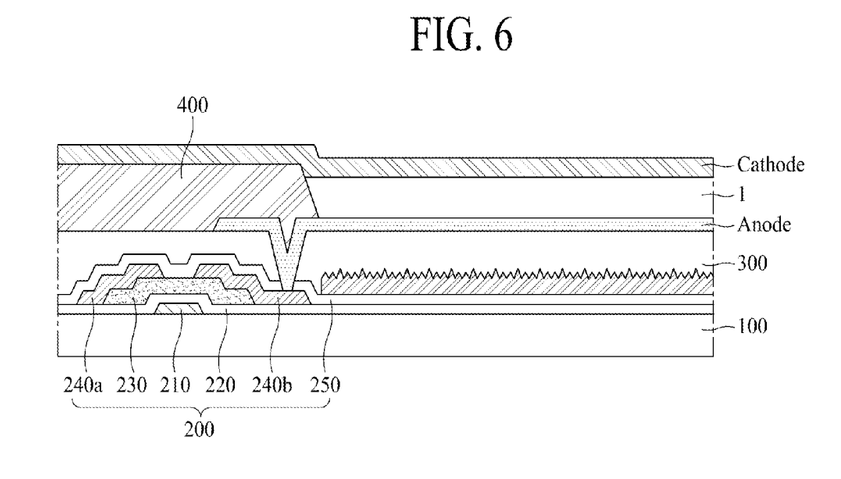
FIG. 6 is a schematic cross-sectional view of an organic light emitting display apparatus according to an embodiment of the present invention.

FIG. 6 is a schematic cross-sectional view of an organic light emitting display apparatus according to an embodiment of the present invention and uses the above-described organic light emitting device of FIG. 2.

As seen in FIG. 6, the organic light emitting display apparatus according to an embodiment of the present invention may include a substrate 100, a thin film transistor (TFT) layer 200, a planarization layer 300, a bank layer 400, an anode, an organic layer 1, and a cathode.

The substrate 100 may be glass or transparent plastic (for example, polyimide or the like) capable of being bent or curved, but is not limited thereto.

The TFT layer 200 may be formed on the substrate 100. The TFT layer 200 may include a gate electrode 210, a gate insulation layer 220, a semiconductor layer 230, a source electrode 240a, a drain electrode 240b, and a passivation layer 250.

The gate electrode 210 may be formed to be patterned on the substrate 100, and the gate insulation layer 220 may be formed on the gate electrode 210. The semiconductor layer 230 may be formed to be patterned on the gate insulation layer 220, and the source electrode 240a and the drain electrode 240b may be formed to be patterned on the semiconductor layer 230 to face each other. The passivation layer 250 may be formed on the source electrode 240a and the drain electrode 240b.

A TFT illustrated as including the TFT layer 200 relates to a driving TFT, and although a driving TFT having a bottom gate structure where the gate electrode 210 is formed under the semiconductor layer 230 is illustrated in the drawing, a driving TFT having a top gate structure where the gate electrode 210 is formed over the semiconductor layer 230 may be provided. Emission of light from an organic light emitting device may be controlled by the driving TFT.

The planarization layer 300 may be formed on the TFT layer 200 to planarize a surface of the substrate 100. The planarization layer 300 may be formed of an organic insulation layer such as photo acryl or the like, but is not limited thereto.

The anode may be formed on the planarization layer 300 and may be connected to the drain electrode 240b of the TFT layer 200.

The bank layer 400 may be formed on the anode and may be formed to be patterned in a matrix structure to define a pixel area.

The organic layer 1 may be formed on the anode, and particularly may be formed in the pixel area defined by the bank layer 400. Although not shown in detail, the organic layer 1 may include an HIL, an HTL, an EML including a first EML and a second EML, and an EIL. The layers are the same as the organic layers described above with reference to FIG. 2, and thus, repetitive descriptions are not provided.

The cathode may be formed on the organic layer 1. A common voltage may be applied to the cathode. Thus, the cathode may be formed on the bank layer 400 in addition to the organic layer 1 which is provided in each of a plurality of pixels.

Although not shown, an encapsulation layer may be formed on the cathode to prevent oxygen and/or water from penetrating into the organic layer 1. The encapsulation layer may be formed in a structure where different inorganic materials are alternately stacked, may be formed in a structure where an inorganic material and an organic material are alternately stacked, or may be formed as a metal layer which is adhered to a corresponding layer by an adhesive.

The organic light emitting display apparatus according to an embodiment of the present invention may be manufactured as a top emission type in which light emitted from the organic layer 1 is transferred in an up direction away from the substrate, or may be manufactured as a bottom emission type in which the light emitted from the organic layer 1 is transferred in a direction of the substrate 100 disposed thereunder.

According to the embodiments of the present invention, since an ETL is not provided between the EML and the EIL, the vacuum deposition process is reduced. As a result, productivity is enhanced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device, comprising:
   an anode;
   a hole injecting layer on the anode;
   a hole transporting layer on the hole injecting layer;
   an emission layer on the hole transporting layer, wherein the emission layer includes a host material and a dopant material;
   an electron injecting layer on the emission layer; and
   a cathode on the electron injecting layer,
   wherein the emission layer comprises a first emission layer on the hole transporting layer, and a second emission layer directly on the first emission layer, and
   wherein the second emission layer comprises a same material as a material of the first emission layer and further comprises an n-type dopant material.

2. The organic light emitting device of claim 1, wherein each of the first emission layer and the second emission layer further comprises a provider of an electron which is chemically bonded to or mixed with the host material or the dopant material.

3. The organic light emitting device of claim 2, wherein the provider of the electron comprises pyridine or quinolone that is chemically bonded to the host material or the dopant material.

4. The organic light emitting device of claim 2, wherein the provider of the electron comprises an organic material mixed with the host material or the dopant material and has an electron-transporting characteristic.

5. The organic light emitting device of claim 1, wherein the electron injecting layer contacts the second emission layer and comprises a same n-type dopant material as the n-type dopant material in the second emission layer.

6. The organic light emitting device of claim 1, wherein a thickness of the emission layer is 50 nm to 100 nm.

7. The organic light emitting device of claim 1, wherein a thickness of the electron injecting layer is 2 nm to 10 nm.

8. A method of manufacturing an organic light emitting device, the method comprising:
   forming a hole injecting layer on an anode using a solution process;
   forming a hole transporting layer on the hole injecting layer using a solution process;
   forming an emission layer on the hole transporting layer using the solution process, the emission layer comprising a host material and a dopant material;
   forming an electron injecting layer on the emission layer using a vacuum deposition process, the electron injecting layer comprising n-type dopants; and
   forming a cathode on the electron injecting layer,
   wherein the forming the electron injecting layer comprises diffusing the n-type dopants to the emission layer to form a first emission layer, to which the n-type dopants are not diffused, and a second emission layer with the n-type dopants diffused thereto.

9. The method of claim 8, wherein the emission layer further comprises a provider of an electron that is chemically bonded to or mixed with the host material or the dopant material.

10. The method of claim 8, wherein
    the forming the hole injecting layer comprises dissolving an organic material having a hole-injecting characteristic in a first solvent to prepare a first solution, wherein the prepared first solution is coated on the anode,
    the forming the hole transporting layer comprises dissolving an organic material having a hole-transporting characteristic in a second solvent to prepare a second solution, wherein the prepared second solution is coated on the hole injecting layer, and
    wherein the organic material having the hole-injecting characteristic is not dissolved by the second solvent.

11. The method of claim 10, wherein the second solution further comprises a cross-linking agent.

12. An organic light emitting display apparatus, comprising:
    a substrate;
    a thin film transistor on the substrate; and
    an organic light emitting device, wherein emission of light from the organic light emitting device is controlled by the thin film transistor,
    wherein the organic light emitting device comprises:
    an anode;
    a hole injecting layer disposed on the anode;
    a hole transporting layer disposed on the hole injecting layer;
    an emission layer on the hole transporting layer, wherein the emission layer includes a host material and a dopant material;
    an electron injecting layer on the emission layer; and
    a cathode on the electron injecting layer,
    wherein the emission layer comprises a first emission layer on the hole transporting layer, and a second emission layer directly on the first emission layer, and
    the second emission layer comprises a same material as a material of the first emission layer and further comprises an n-type dopant material.

13. The organic light emitting display apparatus of claim 12, wherein each of the first emission layer and the second emission layer further comprises a provider of an electron that is chemically bonded to or mixed with the host material or the dopant material.

14. The organic light emitting display apparatus of claim 13, wherein the provider of the electron comprises pyridine or quinolone which is chemically bonded to the host material or the dopant material.

15. The organic light emitting display apparatus of claim 13, wherein the provider of the electron comprises an organic material that is mixed with the host material or the dopant material and has an electron-transporting characteristic.

16. The organic light emitting display apparatus of claim 12, wherein the electron injecting layer contacts the second emission layer and comprises the same n-type dopant material as the n-type dopant material comprised in the second emission layer.

17. The organic light emitting display apparatus of claim 12, wherein a thickness of the emission layer is 50 nm to 100 nm.

18. The organic light emitting display apparatus of claim 12, wherein a thickness of the electron injecting layer is 2 nm to 10 nm.

* * * * *